(12) United States Patent
Chiang et al.

(10) Patent No.: US 7,732,890 B2
(45) Date of Patent: Jun. 8, 2010

(54) INTEGRATED CIRCUIT WITH HIGH VOLTAGE JUNCTION STRUCTURE

(75) Inventors: Chiu-Chih Chiang, Hsinchu (TW); Chih-Feng Huang, Hsinchu County (TW); You-Kuo Wu, Taipei County (TW); Long Shih Lin, Hsinchu County (TW)

(73) Assignee: System General Corp., Taipei Hsien (TW)

( * ) Notice: Subject to any disclaimer, the term of this patent is extended or adjusted under 35 U.S.C. 154(b) by 834 days.

(21) Appl. No.: 11/426,941

(22) Filed: Jun. 28, 2006

(65) Prior Publication Data

US 2008/0001195 A1    Jan. 3, 2008

(51) Int. Cl.
*H01L 29/00* (2006.01)
(52) U.S. Cl. ............... 257/500; 257/376; 257/544; 257/E25.01
(58) Field of Classification Search .......... 257/500, 257/544, 355, 776, E25.01
See application file for complete search history.

(56) References Cited

U.S. PATENT DOCUMENTS

| 5,714,796 | A  | * | 2/1998  | Chishiki ............... 257/544 |
| 6,344,959 | B1 |   | 2/2002  | Milazzo |
| 6,781,422 | B1 |   | 8/2004  | Yang |
| 6,836,173 | B1 |   | 12/2004 | Yang |
| 2002/0195659 | A1 | * | 12/2002 | Jimbo et al. ........... 257/343 |

* cited by examiner

*Primary Examiner*—Matthew E Warren
(74) *Attorney, Agent, or Firm*—Jianq Chyun IP Office

(57) ABSTRACT

The high voltage integrated circuit comprises a P substrate. An N well barrier is disposed in the substrate. Separated P diffusion regions forming P wells are disposed in the substrate for serving as the isolation structures. The low voltage control circuit is located outside the N well barrier. A floating circuit is located inside the N well barrier. In order to develop a high voltage junction barrier in between the floating circuit and the substrate, the maximum space of devices of the floating circuit is restricted.

11 Claims, 5 Drawing Sheets

INTEGRATED CIRCUIT WITH HIGH VOLTAGE JUNCTION STRUCTURE

BACKGROUND OF THE INVENTION

1. Field of the Invention

The present invention relates to an integrated circuit, and more particularly to a high voltage integrated circuit.

2. Description of the Prior Art

A variety of power supplies and motor drivers utilize the bridge circuits to control a power source to the load. The bridge circuit normally has a high-side transistor connected to the power source and a low-side transistor connected to ground. A common node between the high-side transistor and low-side transistor is coupled to the load. As transistors are controlled to alternately conduct, the voltage of the common node swings between the voltage of the power source and the ground. Therefore the control of high-side transistor requires a charge pump circuit and/or a floating driver in order to fully turn on the high-side transistor. In recent development, many floating circuits are disclosed in U.S. Pat. No. 6,344,959 (Milazzo), U.S. Pat. No. 6,781,422 (Yang) and U.S. Pat. No. 6,836,173 (Yang).

FIG. 1 shows a high-side transistor drive circuit, in which a circuit 10 is the floating driver. A capacitor 40 provides a supply voltage to the floating driver 10. A voltage $V_D$ charges the capacitor 40 through a diode 45 once the low-side transistor 30 is switched on. The ground reference of the capacitor 40 is pulled to the level of the voltage source VIN when the high-side transistor 20 is turned on. This happens, because turning on the high-side transistor 20 shifts the bridge circuit into a low impedance state.

SUMMARY OF THE INVENTION

Accordingly, an objective of the present invention is to provide a monolithic IC process to integrate the low-voltage control circuits with a high-voltage floating drive circuit. Furthermore, the integration is achieved by using a typical IC process, so as to accomplish the low cost and high production yield.

According to an embodiment of the present invention, a high voltage integrated circuit comprises a P substrate. An N diffusion region containing N conductivity type forms an N well barrier disposed in the substrate. Separated P diffusion regions containing the P conductivity type form P wells are disposed in the substrate for serving as the isolation structures. The low voltage control circuit is located outside the N well barrier. A floating circuit is located inside the N well barrier. A high voltage junction barrier is formed to isolate the control circuit and the floating circuit. Furthermore, in order to develop a high voltage junction barrier between the floating circuit and the substrate, the maximum space of devices of the floating circuit is restricted.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention.

DESCRIPTION OF THE PREFERRED EMBODIMENTS

Figure 1:
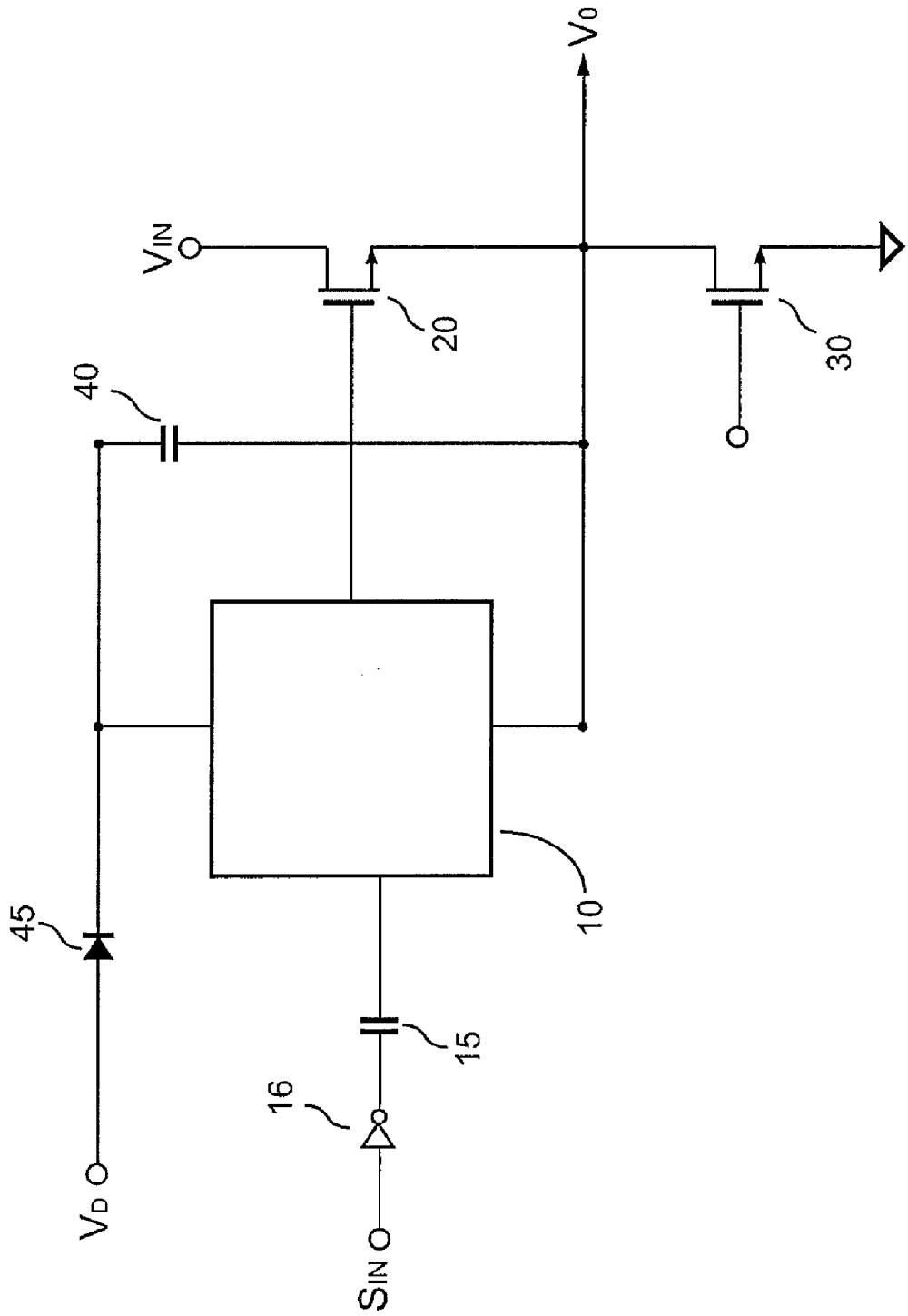
FIG. 1 shows a prior art high-side transistor drive circuit.
Figure 2:
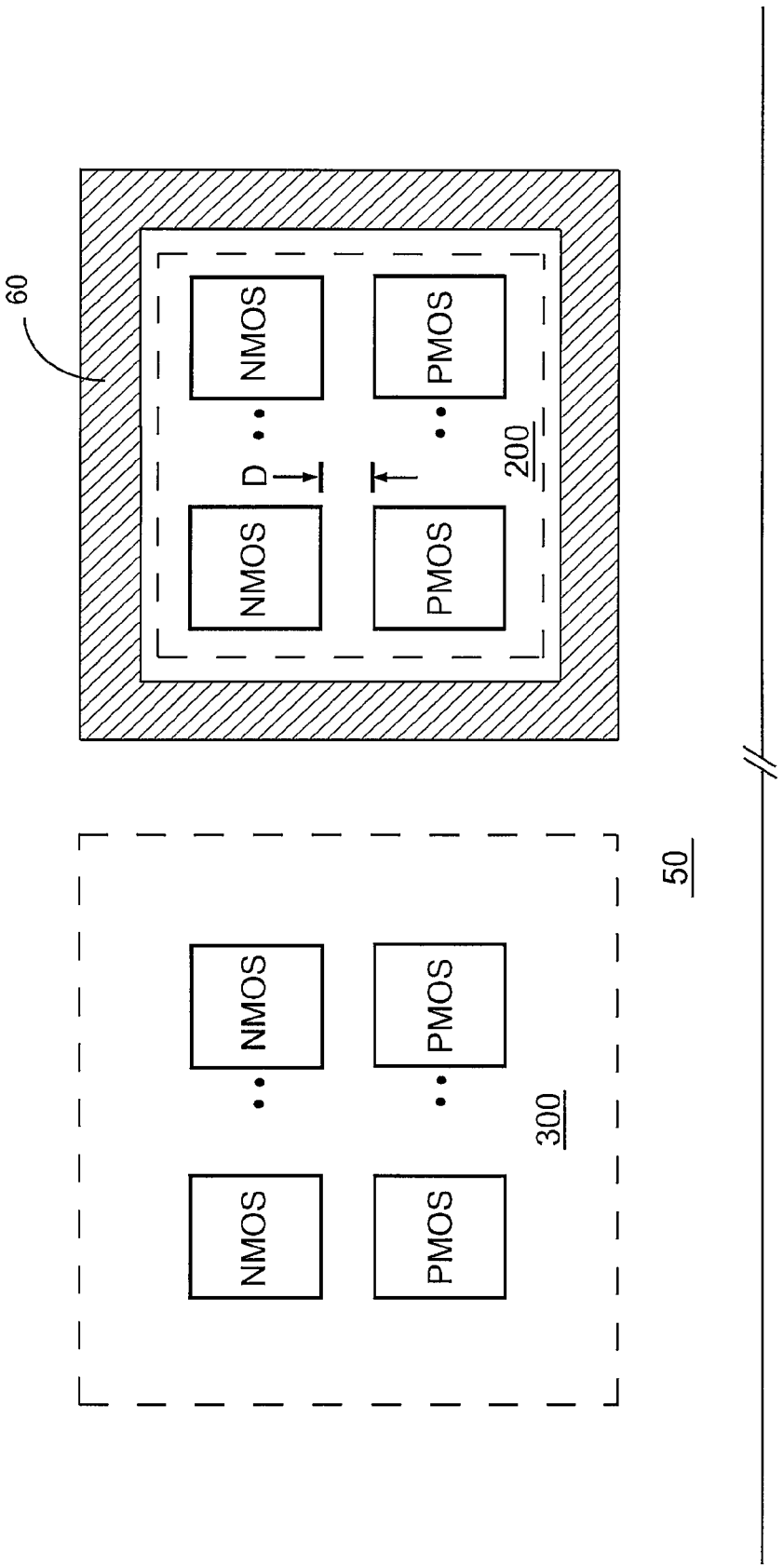
FIG. 2 is a top view of an integrated circuit with high voltage junction structure according to an embodiment of the present invention.

FIG. 2 is a top view of an integrated circuit with high voltage junction structure according to an embodiment of present invention. The integrated circuit includes a P substrate 50, an N diffusion region containing N conductivity type. The N diffusion region forms an N well barrier 60 disposed in the P substrate 50. A low voltage control circuit 300 is located outside the N well barrier 60. A floating circuit 200 is located inside the N well barrier 60. The voltage supplied to the floating circuit 200 is a fixed voltage, as shown in FIG. 1, the voltage supply is connected to the capacitor 40. The ground reference of the voltage supply is thus floated and the ground reference of the transistors in floating drive 10 is also floated.

Figure 3:
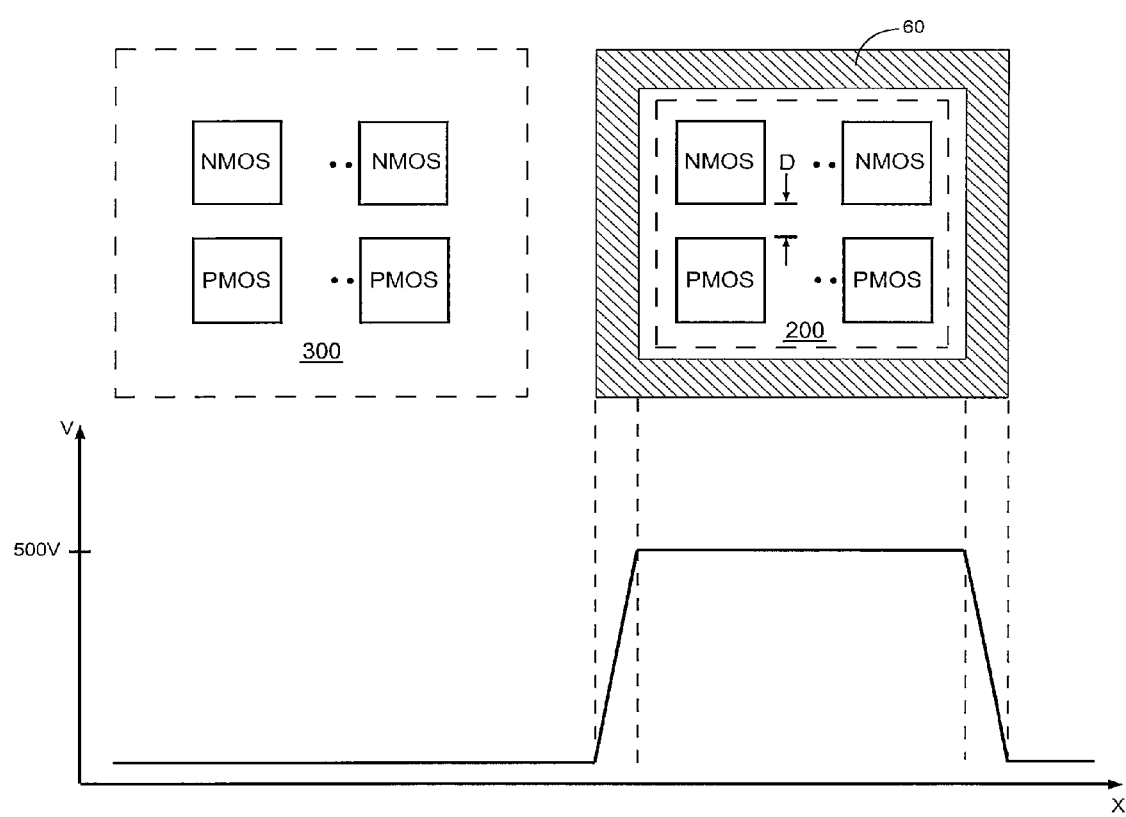
FIG. 3 shows a voltage distribution when 500V is applied to the floating circuit according to an embodiment of the present invention.

FIG. 3 shows a voltage distribution when 500V is applied to the floating circuit 200. A high voltage junction barrier is formed to isolate the control circuit 300 from the floating circuit 200. Furthermore, the restricted space D between devices of the floating circuit 200 converge the electrical field to develop a high voltage junction barrier between the floating circuit 200 and the substrate 50.

Figure 4:
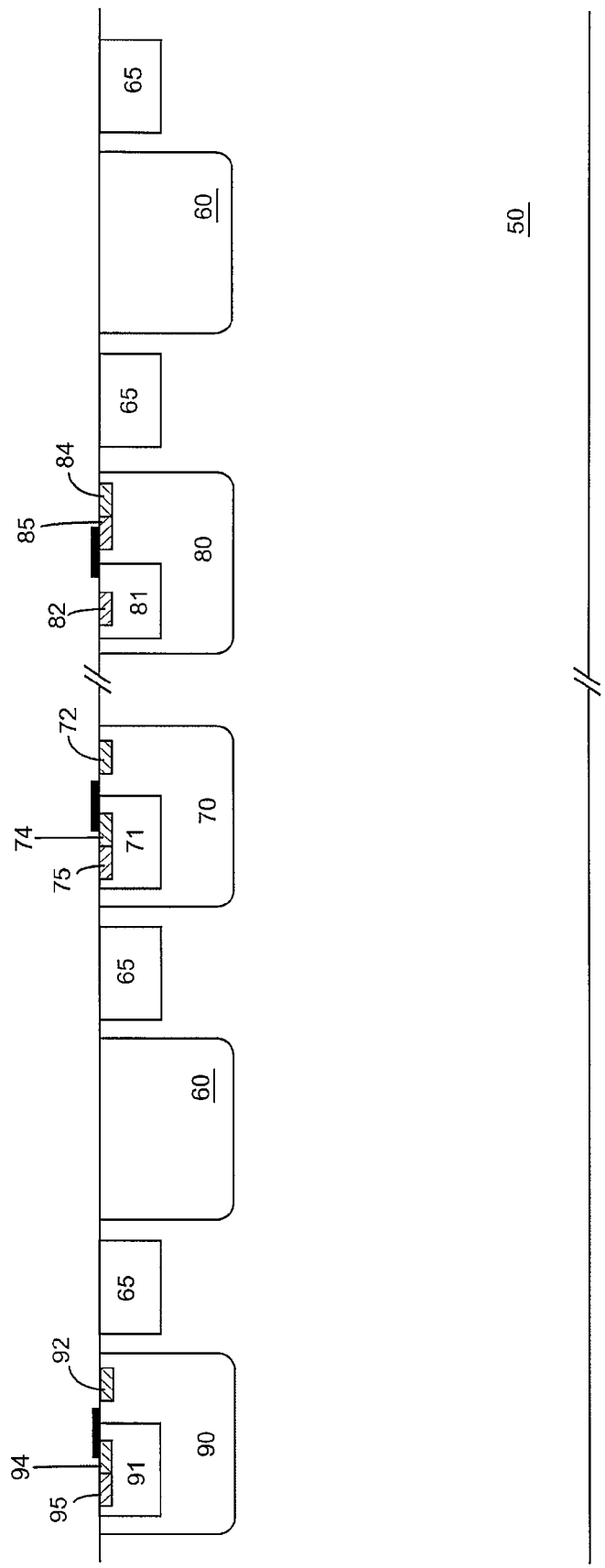
FIG. 4 is a cross-section view of the integrated circuit with high voltage junction structure according to an embodiment of the present invention.

FIG. 4 is a cross-sectional view of a proposed integration circuit, in which P diffusion regions containing the P conductivity type forms P regions 65 disposed in the P substrate 50 for serving as the isolation structures. P regions 65 help to form depletion regions for serving as the isolation structures. The control circuit 300 and the floating circuit 200 include N type MOSFET devices and P type MOSFET devices. The N type MOSFET device in the floating circuit 200 comprises a first N diffusion region containing N conductivity type, which forms an N well 70 disposed in the substrate 50. A first P diffusion region containing the P conductivity type forms a P region 71 located in the N well 70. A first drain diffusion region having the N+ conductivity type, which forms a drain region 72 disposed in the first N diffusion region. A first source diffusion region having the N+ conductivity type forms a source region 74. A conduction channel is developed between the source region 74 and the drain region 72. A first contact diffusion region containing P+ conductivity type forms a contact region 75. The first P diffusion region encloses the source region 74 and the contact region 75. The P type MOSFET device comprises a second N diffusion region containing N conductivity type, which forms an N well 80 disposed in the substrate 50. A second P diffusion region containing the P conductivity type forms a P region 81 located in the N well 80. A second drain diffusion region having the P+ conductivity type forms a drain region 82 disposed in the second P diffusion region. A second source diffusion region having the P+ conductivity type forms a source region 85. A conduction channel is developed between the source region 85 and the drain region 82. A second contact diffusion region containing N+ conductivity type forms a contact region 84. The second N diffusion region encloses the source region 85 and the contact region 84.

The N type MOSFET device in the control circuit 300 comprises a third N diffusion region containing N conductivity type, which forms an N well 90 disposed in the substrate 50. A third P diffusion region containing the P conductivity type forms a P region 91 located in the N well 90. A third drain diffusion region having the N+ conductivity type, which forms a drain region 92 disposed in the third N diffusion region. A third source diffusion region having the N+ conductivity type forms a source region 94. A conduction channel is developed between the source region 94 and the drain region 92. A third contact diffusion region containing P+ conductivity type forms a contact region 95. The third P diffusion region encloses the source region 94 and the contact region 95.

Figure 5:
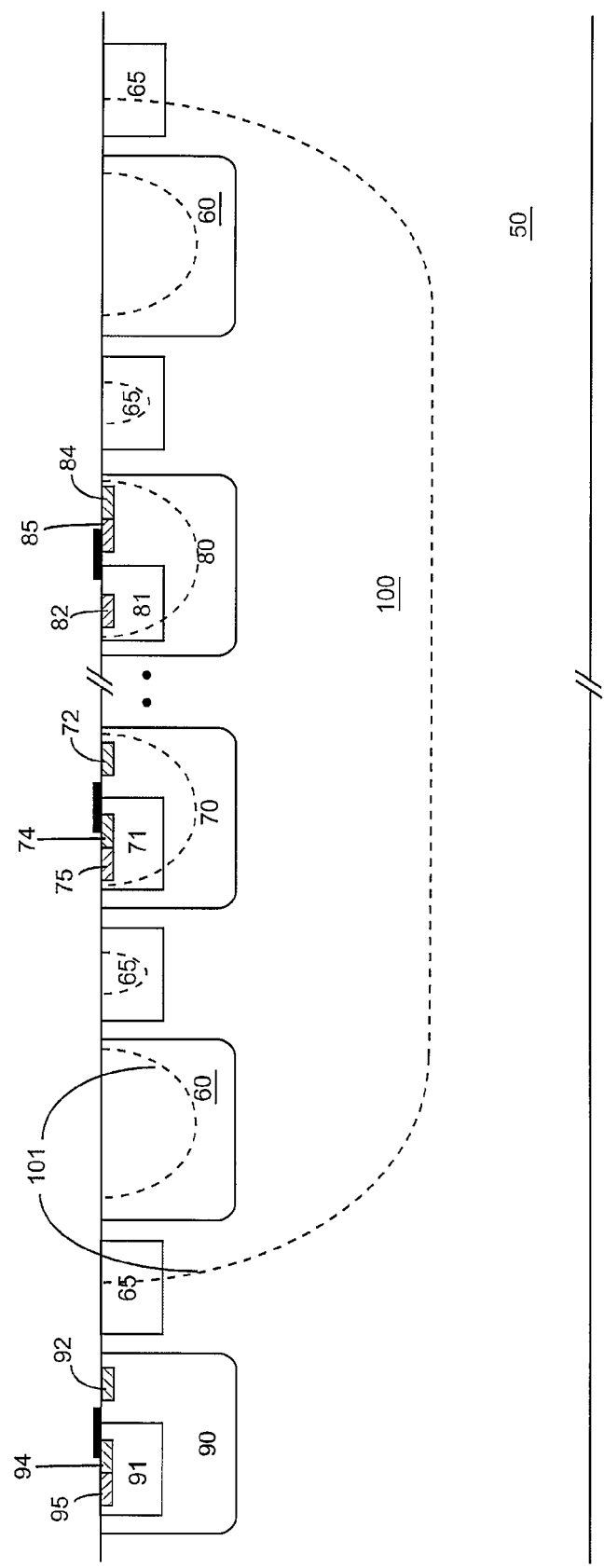
FIG. 5 shows a depletion region when a high voltage is applied to the floating circuit according to an embodiment of the present invention.

FIG. 5 shows a depletion region 100 between the two high voltage barriers 101 when a high voltage is applied to the floating circuit 200. Because the maximum space D between devices of the floating circuit 200 is limited, which help to develop the high voltage junction barrier 101 between the floating circuit 200 and the substrate 50.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims or their equivalents.

What is claimed is:

1. A high voltage integrated circuit comprising:
    a P substrate;
    a N well barrier in the substrate;
    a control circuit, disposed outside the N well barrier;
    a floating circuit, located inside the N well barrier; and
    a high voltage barrier, formed for isolating the floating circuit from the control circuit when a predetermined high voltage is applied to the floating circuit, wherein, there is a distance between the floating circuit and the high voltage barrier, the distance is larger than 0 micrometer.

2. The high voltage integrated circuit of claim 1, further comprising P diffusion regions in the substrate for serving as isolation structures, wherein the P diffusion regions are disposed between the high voltage barrier and the floating circuit.

3. The high voltage integrated circuit of claim 1, wherein a voltage supply to the floating circuit is fixed and a ground reference of the supply voltage is floated.

4. The high voltage integrated circuit of claim 1, wherein the control circuit and the floating circuit include at least an N type MOSFET device comprising:
    a first N diffusion region, forming a first N well in the substrate;
    a first P diffusion region, forming a first P region in the first N well;
    a first drain diffusion region, forming a first drain region in the first N diffusion region;
    a first source diffusion region, forming a first source region, wherein a conduction channel is formed between the first source region and the first drain region; and
    a first contact P diffusion region, forming a first contact P region, wherein the first P diffusion region encloses the first source region and the first contact P region.

5. The high voltage integrated circuit of claim 1, wherein the control circuit and the floating circuit include at least a P type MOSFET device comprising:
    a second N diffusion region, forming a second N well in the substrate;
    a second P diffusion region, forming a second P region in the second N well;
    a second drain diffusion region, forming a second drain region in the second P diffusion region;
    a second source diffusion region, forming a second source region, wherein a conduction channel is formed between the second source region and the second drain region; and
    a second contact N diffusion region, forming a second contact N region, wherein the second N diffusion region encloses the second source region and the second contact N region.

6. A high voltage integrated circuit, comprising:
    a P substrate;
    a N well barrier in the substrate;
    a control circuit, disposed outside the N well barrier, comprising at least an N type MOSFET device and at least a P type MOSFET device;
    a floating circuit, located inside the N well barrier, comprising at least an N type MOSFET device and at least a P type MOSFET device; and
    a high voltage barrier, formed for isolating the floating circuit from the control circuit when a predetermined high voltage is applied to the floating circuit, wherein, there is a distance between the floating circuit and the high voltage barrier, the distance is larger than 0 micrometer.

7. The high voltage integrated circuit of claim 1, further comprising P diffusion regions in the substrate for serving as isolation structures, wherein the P diffusion regions are disposed between the high voltage barrier and the floating circuit.

8. The high voltage integrated circuit of claim 1, wherein a voltage supply to the floating circuit is fixed and a ground reference of the supply voltage is floated.

9. The high voltage integrated circuit of claim 6, wherein the N type MOSFET device comprises:
    a first N diffusion region, forming a first N well in the substrate;
    a first P diffusion region, forming a first P region in the first N well;
    a first drain diffusion region, forming a first drain region in the first N diffusion region;
    a first source diffusion region, forming a first source region, wherein a conduction channel is formed between the first source region and the first drain region; and
    a first contact P diffusion region, forming a first contact P region, wherein the first P diffusion region encloses the first source region and the first contact P region.

10. The high voltage integrated circuit of claim 6, wherein the P type MOSFET device comprises
    a second N diffusion region, forming a second N well in the substrate;
    a second P diffusion region, forming a second P region in the second N well;
    a second drain diffusion region, forming a second drain region in the second P diffusion region;
    a second source diffusion region, forming a second source region, wherein a conduction channel is formed between the second source region and the second drain region; and a second contact N diffusion region, forming a second contact N region, wherein the second N diffusion region encloses the second source region and the second contact N region.

11. The high voltage integrated circuit of claim 6, wherein a distance between the N type MOSFET device and the P type MOSFET device in the floating circuit is maintained sufficient to converge an electrical field when the predetermined high voltage is applied to the floating gate to generate the high voltage barrier for isolating the floating circuit from the control circuit.

\* \* \* \* \*